(12) United States Patent
Tanaka et al.

(10) Patent No.: US 9,277,658 B2
(45) Date of Patent: Mar. 1, 2016

(54) ELECTRONIC CONTROLLER AND METHOD OF MANUFACTURING THE ELECTRONIC CONTROLLER

(71) Applicant: MITSUBISHI ELECTRIC CORPORATION, Chiyoda-ku, Tokyo (JP)

(72) Inventors: Takaaki Tanaka, Tokyo (JP); Hisakazu Yamane, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 14/247,889

(22) Filed: Apr. 8, 2014

(65) Prior Publication Data

US 2015/0056845 A1 Feb. 26, 2015

(30) Foreign Application Priority Data

Aug. 23, 2013 (JP) ................................. 2013-173034

(51) Int. Cl.
| | |
|---|---|
| *H05K 5/00* | (2006.01) |
| *H01R 13/645* | (2006.01) |
| *H01R 13/64* | (2006.01) |
| *H01R 13/629* | (2006.01) |
| *H01R 12/70* | (2011.01) |
| *H01R 12/72* | (2011.01) |

(52) U.S. Cl.
CPC .......... *H05K 5/0043* (2013.01); *H01R 12/7005* (2013.01); *H01R 12/724* (2013.01); *H01R 13/629* (2013.01); *H01R 13/64* (2013.01); *H01R 13/6456* (2013.01); *Y10T 29/4913* (2015.01)

(58) Field of Classification Search
CPC ............... H01R 13/6456; H01R 13/64; H01R 12/7005; H01R 13/629
USPC ................................................... 439/680, 681
See application file for complete search history.

(56) References Cited

U.S. PATENT DOCUMENTS 6,773,272 B2 * 8/2004 Koehler ............... H01R 12/724
439/620.01

FOREIGN PATENT DOCUMENTS

JP 2-66865 A 3/1990

* cited by examiner

*Primary Examiner* — Abdullah Riyami
*Assistant Examiner* — Justin Kratt
(74) *Attorney, Agent, or Firm* — Sughrue Mion, PLLC; Richard C. Turner

(57) ABSTRACT

Provided is an electronic controller which enables an opening direction of a connector to be set along an electronic circuit board. The electronic controller includes first guiding projections (7a) and second guiding projections (7b) formed on a cover (2), and first guiding grooves (8a) to be brought into engagement with the first guiding projections (7a) and second guiding grooves (8b) to be brought into engagement with the second guiding projections (7b), which are formed on pin headers (4). The first guiding projections (7a) and the second guiding projections (7b) move respectively along the first guiding grooves (8a) and the second guiding grooves (8b). As a result, the pin headers (4) turn to be assembled to housings (14).

9 Claims, 7 Drawing Sheets

ELECTRONIC CONTROLLER AND METHOD OF MANUFACTURING THE ELECTRONIC CONTROLLER

BACKGROUND OF THE INVENTION

1. Field of the Invention

The present invention relates to an electronic controller including an electronic circuit board carrying a pin header mounted thereon, which is received within a casing, and to a method of manufacturing the electronic controller.

2. Description of the Related Art

An electronic controller used to control a vehicle or the like generally includes electronic components such as an input/output circuit, a communication circuit, a microcomputer, and a power supply circuit, which are mounted on an electronic circuit board. In addition, a connector for connection to an external device is also provided on the electronic circuit board. The electronic circuit board, on which the electronic components and the connector are mounted, is received within a casing.

In the electronic controller, the electronic circuit board is sandwiched between a base and a cover formed integrally with the connector. The base and the cover are vertically separated from one another. Surfaces of the base and the cover, which are brought into contact with each other, are bonded by a water-proof sealing material or the like.

Further, there is known a connector, which is manufactured as follows. A pin header formed by inserting terminals into a pedestal made of a resin and a housing which surrounds distal end portions of the terminals are configured as independent bodies. Only the pin header is mounted in advance on the electronic circuit board. Thereafter, the housing is assembled at a position corresponding to the pin header. In this manner, the connector is manufactured (see Japanese Patent Application Laid-open No. Hei 02-66865, for example).

The following electronic controller and method of assembling the electronic controller are also known. Specifically, through the application of the above-mentioned technology to a structure of the electronic controller described above, the pin header is mounted in advance onto the electronic circuit board. The electronic circuit board is sandwiched between the base and the cover formed integrally with the housing of the connector. Then, the surfaces of the base and the cover, which are brought into contact with each other, are bonded by the water-proof sealing material.

For the electronic controller having the configuration described above, however, the pin header is necessarily required to be prevented from interfering with the cover when the electronic circuit board having the pin header mounted thereon is assembled to the cover formed integrally with the housing. Therefore, there is a problem in that an opening direction of the connector is necessarily restricted to a vertical direction with respect to a mounting surface of the electronic circuit board.

Moreover, in the case of a connector having a structure in which the distal end portions of the terminals inside the housing are located relatively on a far side, the opening direction of the connector can be sometimes exceptionally set to a horizontal direction with respect to the mounting surface of the electronic circuit board as long as the pin header does not project from an outer shape of the electronic circuit board. However, there is a restriction depending on the shape of the connector to be used. Therefore, there is a problem in that selectable connectors are extremely limited.

SUMMARY OF THE INVENTION

The present invention has been made to solve the problems described above, and therefore has an object to provide an electronic controller without the restrictions described above, which enables an opening direction of a connector to be set to a direction along an electronic circuit board even when a housing of a connector is formed integrally with one of a pair of casing members and the electronic circuit board is sandwiched between the pair of casing members.

According to one embodiment of the present invention, there is provided an electronic controller, including: an electronic circuit board having electronic components mounted thereon; a casing for receiving the electronic circuit board therein, including at least a first casing member and a second casing member; and a connector to be electrically connected to an external device, in which: the connector includes: a pin header fixed onto the electronic circuit board and including a plurality of terminals whose base end portions electrically connected to the electronic circuit board, the plurality of terminals being inserted into a pedestal; and a housing provided integrally with the first casing member, which surrounds distal end portions of the plurality of terminals extending in a direction along the electronic circuit board; one of the pin header and the first casing member includes a guiding projection, whereas another of the pin header and the first casing member includes a guiding portion to be brought into engagement with the guiding projection; and the guiding projection moves along the guiding portion relative thereto to turn the pin header to assemble the pin header to the housing.

Further, according to one embodiment of the present invention, there is provided a method of manufacturing the electronic controller, the method including: mounting the pin header onto the electronic circuit board; bringing the guiding projection into engagement with the guiding portion in a state in which the electronic circuit board is inclined with respect to the first casing member; and assembling the electronic circuit board to the first casing member by turning the electronic circuit board in a state in which the guiding projection is held in engagement with the guiding portion to simultaneously turn the pin header so as to assemble the pin header to the housing.

In the electronic controller according to the one embodiment of the present invention, the guiding projection provided to one of the pin header and the first casing member moves along the guiding portion provided to another of the pin header and the first casing member relative thereto. As a result, the pin header turns along a predetermined trajectory to be mounted to the housing.

Therefore, even in the case of the electronic controller in which the housing of the connector is formed integrally with one of the casing members and the electronic circuit board is sandwiched between the pair of casing members, the electronic controller, in which an opening direction of the connector is set along the electronic circuit board, can be obtained.

Moreover, the method of manufacturing the electronic controller according to one embodiment of the present invention includes the assembling of the electronic circuit board to the first casing member by turning the electric circuit board in the state in which the guiding projection is held in engagement with the guiding portion to automatically turn the pin header so as to assemble the pin header to the housing.

Therefore, by turning the electronic circuit board so that the electronic circuit board is assembled to the first casing member, the pin header is automatically assembled to the housing of the connector. As a result, the electronic controller, in which the opening direction of the connector is set along the electronic circuit board, can be easily manufactured.

DETAILED DESCRIPTION OF THE PREFERRED EMBODIMENTS

Figure 1:
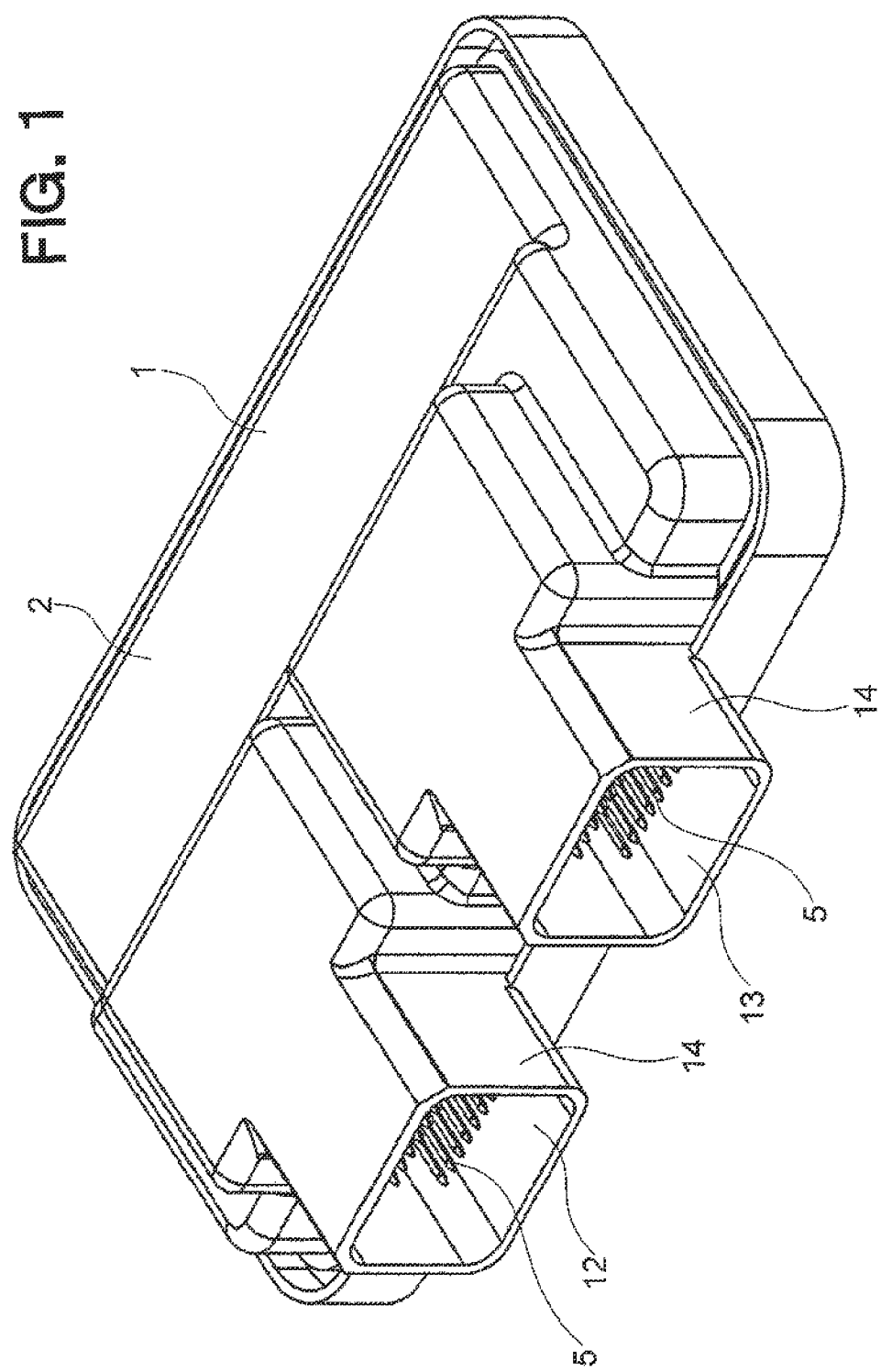
FIG. 1 is a perspective view illustrating an electronic controller according to a first embodiment of the present invention.

Now, an electronic controller according to each of the embodiments of the present invention is described referring to the accompanying drawings. In the drawings, the same or equivalent components and parts are denoted by the same reference symbols for description.

First Embodiment

Figure 2:
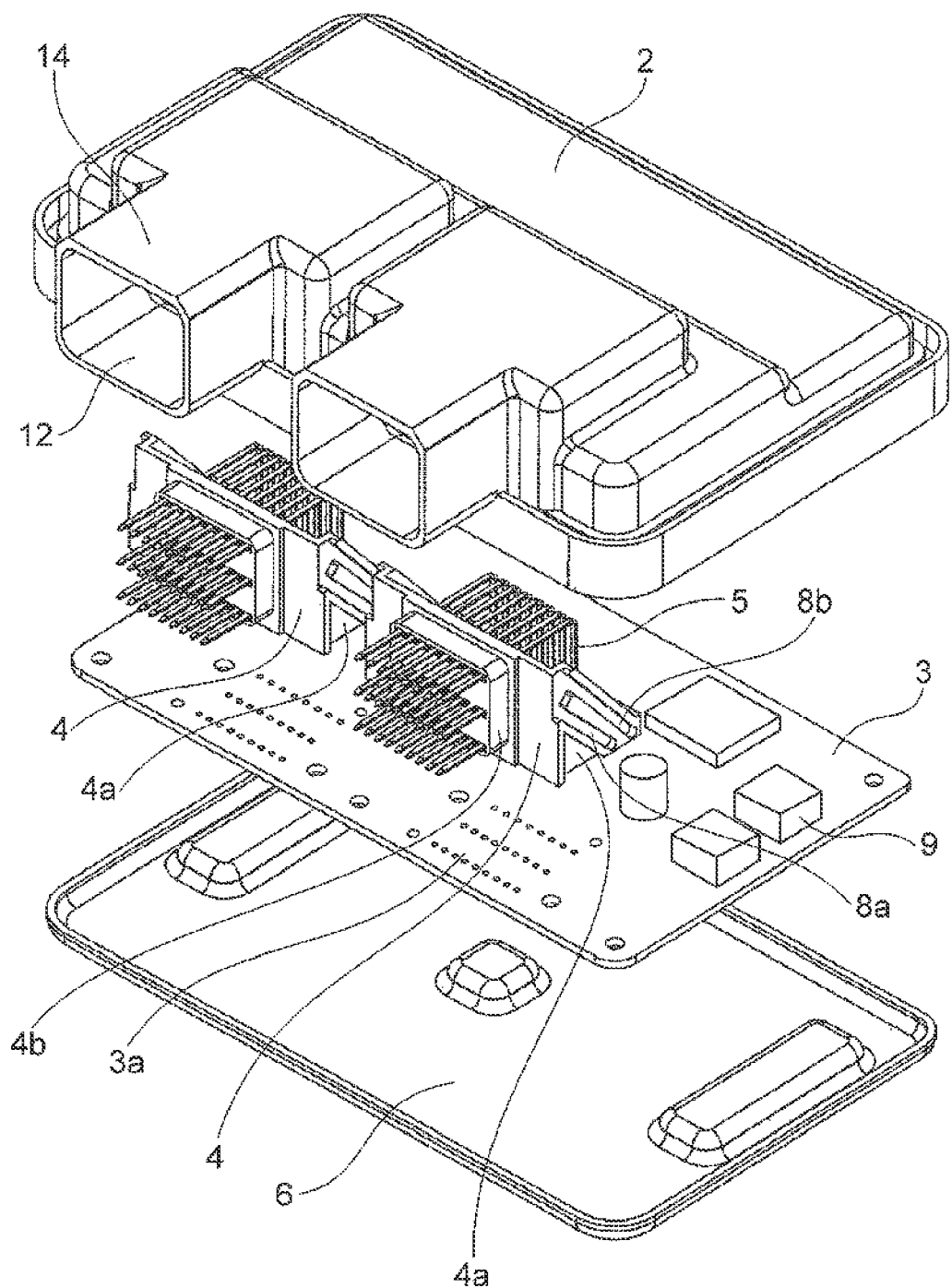
FIG. 2 is an exploded perspective view of the electronic controller illustrated in FIG. 1.
Figure 3:
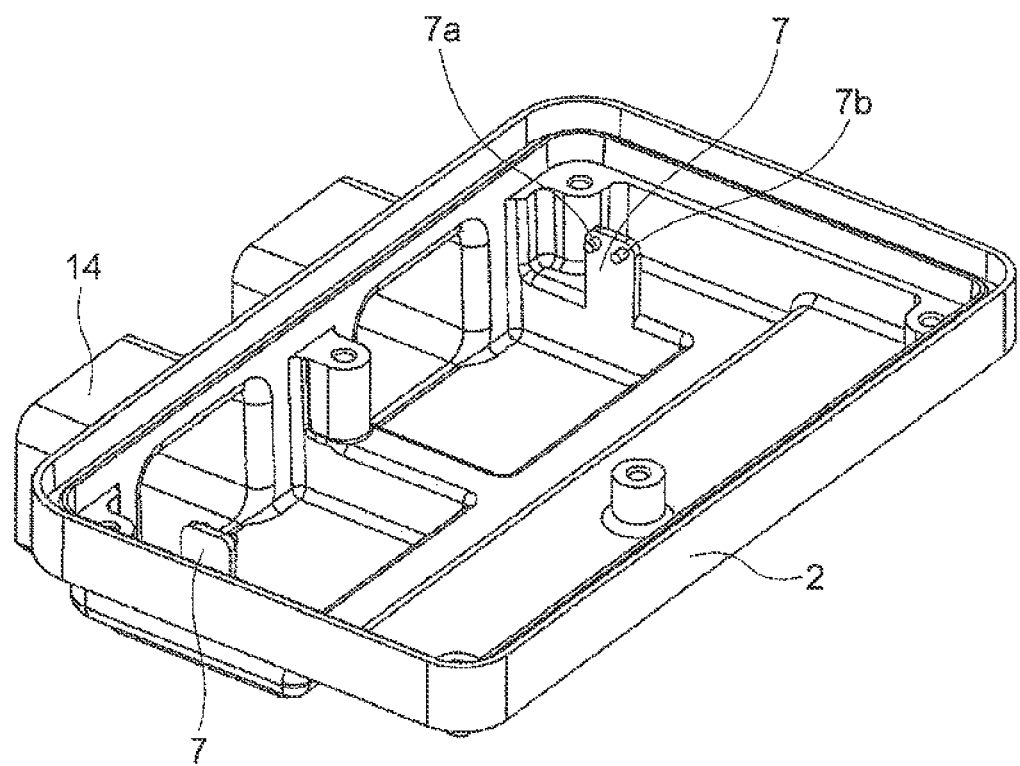
FIG. 3 is a perspective view of a cover illustrated in FIG. 2 as viewed from the inner side.

FIG. 1 is a perspective view illustrating an electronic controller 1 according to a first embodiment of the present invention, FIG. 2 is an exploded perspective view of the electronic controller 1 illustrated in FIG. 1, and FIG. 3 is a perspective view of a cover 2 illustrated in FIG. 2 as viewed from the inner side.

The electronic controller 1 is mounted in, for example, an engine provided in an engine room. The electronic controller 1 includes a casing and an electronic circuit board 3 received within the casing.

The casing has a vertically-divided structure including a cover 2 which is a first casing member and a base 6 which is a second casing member. The cover 2 is made of, for example, a PBT resin or the like. The base 6 is made of, for example, aluminum, stainless steel, a PBT resin, or the like.

Electronic components 9 and pin headers 4 are mounted on the electronic circuit board 3. Each of the pin headers 4 includes a plurality of terminals 5 to be inserted into a pedestal 4b. A base end of each of the terminals 5, which are bent into an L-like shape, is inserted into a through hole 3a of the electronic circuit board 3 to be electrically connected to the electronic circuit board 3. A distal end of each of the terminals 5 extends in parallel to a mounting surface of the electronic circuit board 3 to be electrically connected to an external device (not shown).

On both sides of each of the pedestals 4b, side-surface portions 4a, each having a triangular shape, extending in the same direction as the direction of extension of the distal ends of the terminals 5, are provided. On each of the side-surface portions 4a, a first guiding groove 8a which is a first guiding portion and a second guiding groove 8b which is a second guiding portion are formed so as to be opposed to each other in nonparallel.

Each of the first guiding groove 8a and the second guiding groove 8b, which are linear, is open at a start end and is closed at the front of a terminal end on the side opposite to the start end.

The distal ends of the terminals 5 are surrounded by housings 14 formed integrally with the cover 2, and are oriented toward opening portions 12 of the housings 14.

In this case, each connector 13 is formed by the pin header 4 and the housing 14.

A pair of supporting portions 7 are formed on the cover 2 so as to be opposed to each other. A first guiding projection 7a and a second guiding projection 7b are formed on each of the supporting portions 7. The first guiding projection 7a is to be brought into engagement with the first guiding groove 8a, whereas the second guiding projection 7b is to be brought into engagement with the second guiding groove 8b.

In this embodiment, the pin headers 4 are arranged side by side, and the first guiding groove 8a and the second guiding groove 8b are formed on each of the side-surface portions 4a. However, it is the first guiding grooves 8a and the second guiding grooves 8b formed on the outer side-surface portions 4a that are brought into engagement with the first guiding projections 7a and the second guiding projections 7b.

Figure 4:
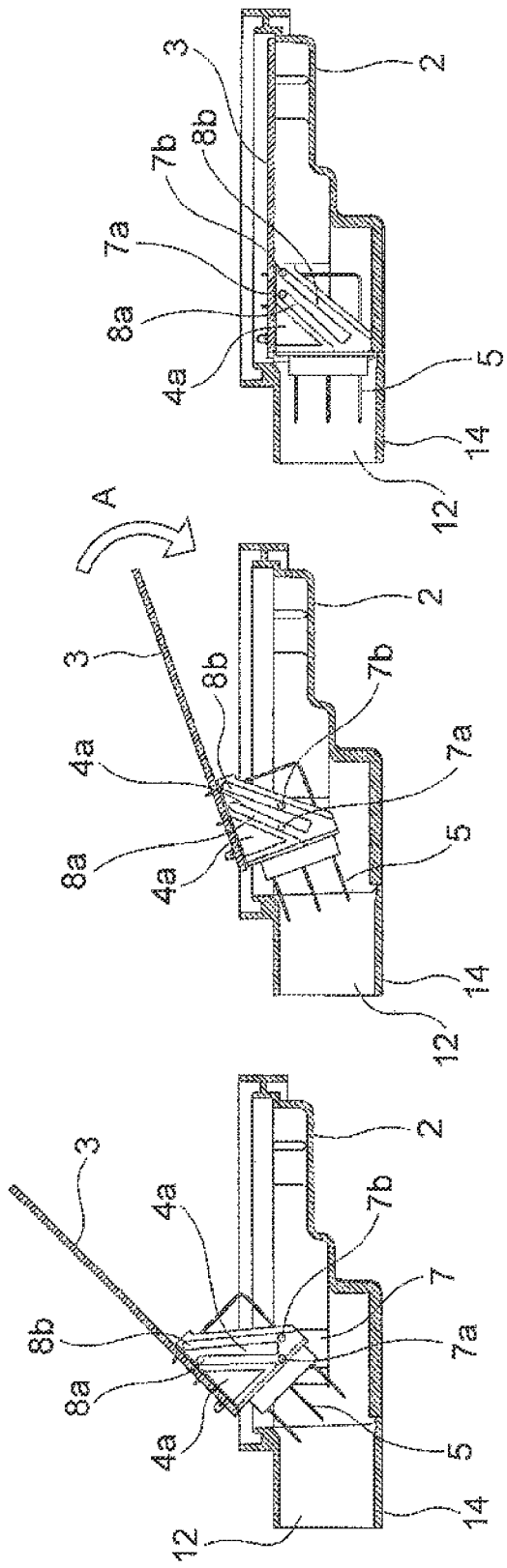
FIGS. 4A, 4B and 4C are sectional views of a principal part of each procedure of assembly of the electric circuit board to the cover according to the electronic controller illustrated in FIG. 1.

Next, a procedure of assembly of the electronic circuit board 3 to the cover 2 is described referring to FIGS. 4A to 4C.

The terminals 5 are inserted into the pedestal 4b of each of the pin headers 4 at predetermined positions by outsert or the like.

Subsequently, the base ends of the terminals 5 of the pin headers 4 are inserted into the through holes 3a to be electrically connected to the electronic circuit board 3.

Thereafter, distal ends of the first guiding grooves 8a and the second guiding grooves 8b formed on the outer side-surface portions 4a of the pin headers 4 are aligned with the first guiding projections 7a and the second guiding projections 7b of the supporting portions 7 of the cover 2, respectively (FIG. 4A).

Next, the electronic circuit board 3 is turned in a direction indicated by the arrow A. As a result, the first guiding projections 7a and the second guiding projections 7b slide along the first guiding grooves 8a and the second guiding grooves 8b relative thereto (FIG. 4B). Finally, the first guiding projections 7a and the second guiding projections 7b come into abutment with terminal ends of the first guiding grooves 8a and the second guiding grooves 8b, respectively. As a result, the electronic circuit board 3 is assembled to the cover 2 (FIG. 4C).

Simultaneously, the pin headers 4 are assembled inside the openings 12 of the housings 14 of the connectors 13.

The electronic circuit board 3 is turnably supported by the cover 3 through the pair of side-surface portions 4a formed on both sides of the pair of pin headers 4. Therefore, a stable turning trajectory can be drawn.

Figure 5:
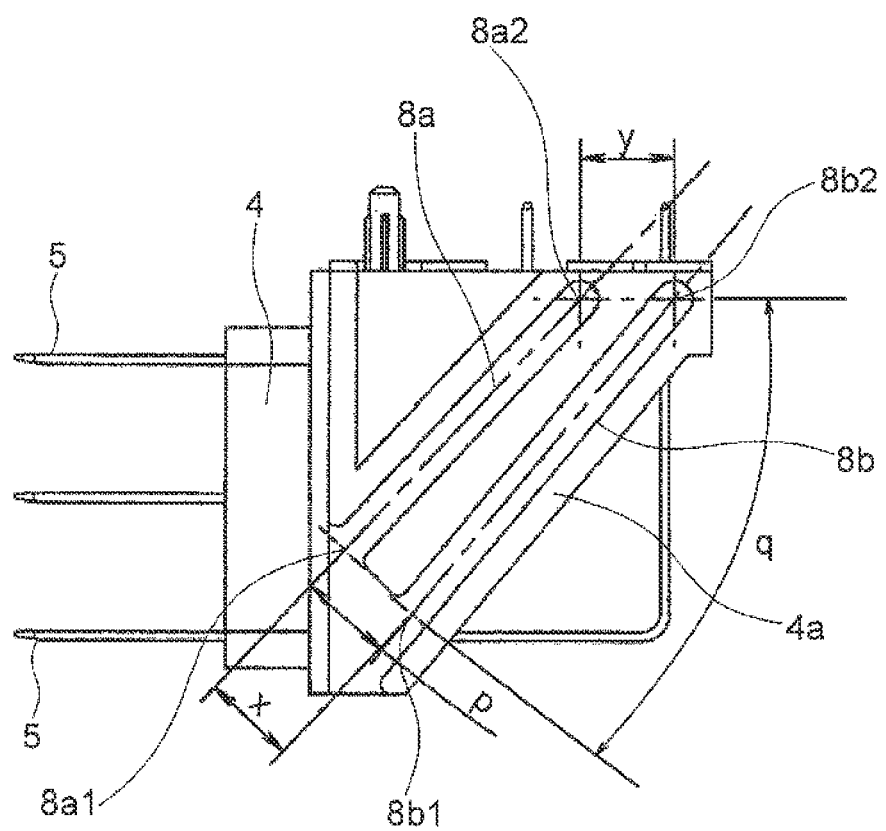
FIG. 5 is a detailed view of the first guiding groove and the second guiding groove illustrated in FIG. 1.

Next, detailed shapes of the first guiding groove 8a and the second guiding groove 8b are described referring to FIG. 5.

In a state illustrated in FIG. 4A, the first guiding projection 7a is located at a first guiding groove start end 8a1, whereas the second guiding projection 7b is located at a second guiding groove start end 8b1 illustrated in FIG. 5.

In a state illustrated in FIG. 4C, the first guiding projection 7a is located at a first guiding groove terminal end 8a2, whereas the second guiding projection 7b is located at a second guiding groove terminal end 8b2.

The relationship between a distance x between the first guiding groove start end 8a1 and the second guiding groove start end 8b1 and a distance y between the first guiding groove terminal end 8a2 and the second guiding groove terminal end 8b2 is expressed by: x=y as can be understood from the fact that the first guiding projection 7a and the second guiding projection 7b, which have a constant distance therebetween, respectively move in the first guiding groove 8a and the second guiding groove 8b.

Moreover, an angle at which a line which connects the first guiding groove start end 8a1 and the second guiding groove start end 8b1 and a line which connects the first guiding groove terminal end 8a2 and the second guiding groove terminal end 8b2 intersect each other is p.

Alternatively, the first guiding groove and the second guiding groove may be formed to extend in a curved manner so as to be opposed to each other at an equal distance therebetween. Then, the first guiding projection and the second guiding projection respectively slide in the first guiding groove and the second guiding groove.

In such a case, there is provided an advantage in that size management is easy as compared with the linear first guiding groove 8a and second guiding groove 8b.

Figure 6:
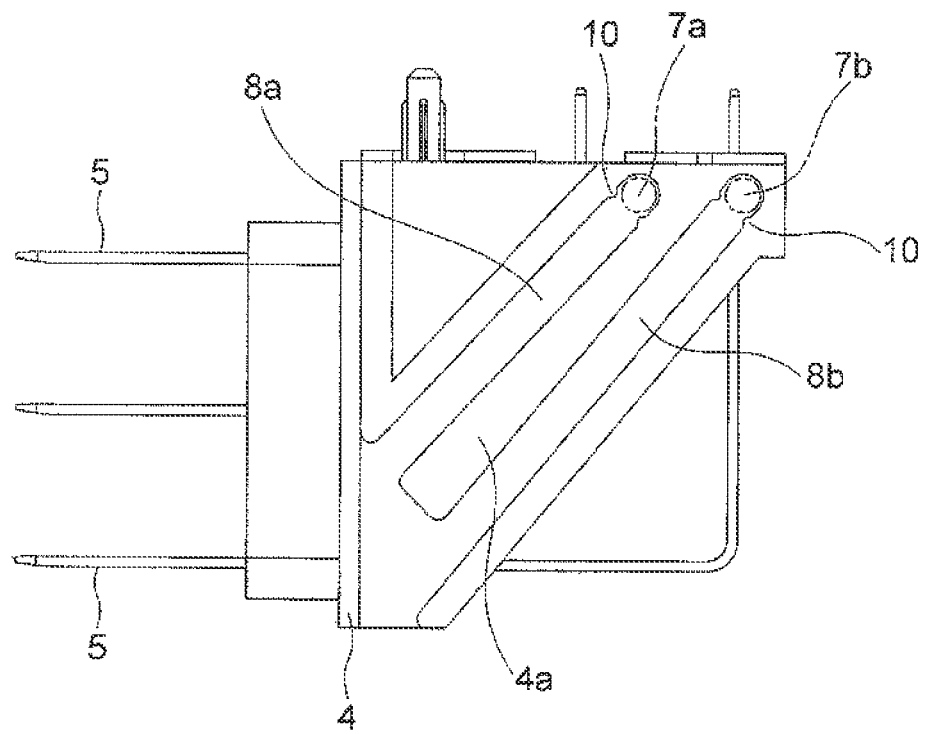
FIG. 6 is a different variation of the first guiding groove and the second guiding groove according to the first embodiment.

FIG. 6 illustrates a variation of the first guiding groove 8a and the second guiding groove 8b according to the first embodiment.

At a terminal end of each of the first guiding groove 8a and the second guiding groove 8b, fixing projections 10 which project inward are formed. The first guiding groove 7a and the second guiding groove 7b are fixed by the fixing projections 10 through which the first guiding groove 7a and the second guiding groove 7b have respectively passed. As a result, the cover 2 and the pin headers 4 are connected to each other.

Figure 7:
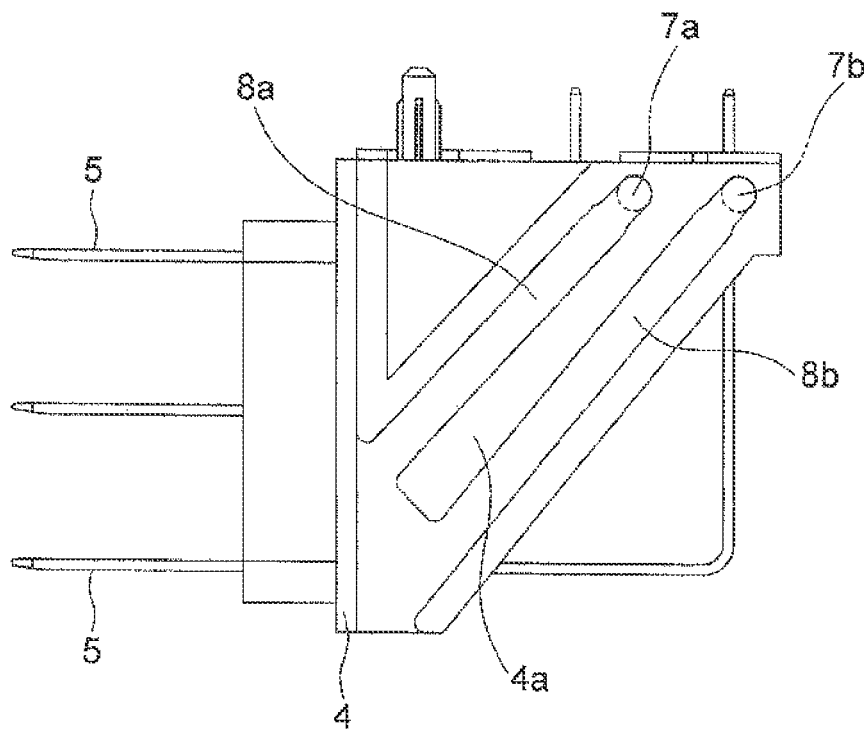
FIG. 7 is a further different variation of the first guiding groove and the second guiding groove according to the first embodiment.

FIG. 7 is a further different variation of the first guiding groove 8a and the second guiding groove 8b according to the first embodiment.

At the terminal end of each of the first guiding groove 8a and the second guiding groove 8b, a small-width portion 11 is formed. A width size of the small-width portion 11 is smaller than a diameter of each of the first guiding projection 7a and the second guiding projection 7b. By pressing the first guiding projection 7a and the second guiding projection 7b into the small-width portions 11, the cover 2 and the pin headers 4 are connected to each other.

According to the electronic controller 1 of the first embodiment, the first guiding projections 7a and the second guiding projections 7b provided to the cover 2 slide along the first guiding grooves 8a and the second guiding grooves 8b provided to the pin headers 4. As a result, the electronic circuit board 3 moves to turn, and hence is assembled to the cover 2.

Therefore, even in the case of the electronic controller 1 in which the housings 14 of the connectors 13 are formed integrally with the cover 2 and the electronic circuit board 3 is sandwiched between the cover 2 and the base 6, the distal ends of the terminals 5 can be oriented toward the openings 12 of the housings 14 without being disturbed by the cover 2. Specifically, the electronic controller 1, in which the opening direction of the connectors 13 is set along the electronic circuit board 3, can be obtained.

Moreover, the first guiding grooves 8a and the second guiding grooves 8b are provided on the side-surface portions 4a which are formed on both sides of the pin headers 4 along the direction in which the terminals 5 extend.

Therefore, when the connectors 13 are fitted to connectors (not shown) which are to be fitted, a large load is applied to the connectors 13. As a result, a large stress is naturally generated on the pin headers 4. However, the side-surface portions 4a formed along the direction of extension of the terminals 5 can resist against the stress. As a result, rigidity of the pin headers 4 is improved.

Moreover, the turning of the electronic circuit board 3 is restricted at two points, that is, the first guiding projection 7a engaged with the first guiding groove 8a and the second guiding projection 7b engaged with the second guiding groove 8b. Therefore, the pin headers 4 turn along a fixed trajectory without deviating therefrom during the turning. As a result, the occurrence of a disadvantageous event, in which the distal ends of the terminals 5 come into contact with wall surfaces of the cover 2 to damage the cover 2, can be prevented.

Moreover, the method of manufacturing the electronic controller 1 according to the first embodiment includes mounting the pin headers 4 onto the electronic circuit board 3, bringing the first guiding projection 7a into engagement with the first guiding groove 8a and the second guiding projection 7b into engagement with the second guiding groove 8b in a state in which the electronic circuit board 3 is inclined with respect to the cover 2, and assembling the electronic circuit board 3 to the cover 2 by turning the electronic circuit board 3 in a state in which the first guiding projection 7a is held in engagement with the first guiding groove 8a and the second guiding projection 7b is held in engagement with the second guiding groove 8b to simultaneously turn the pin headers 4 so that the pin headers 4 are assembled to the housings 14.

Therefore, by turning the electronic circuit board 3 to be assembled to the cover 2, the pin headers 4 are automatically connected to the housings 14 of the connectors 13. As a result, the electronic controller 1, in which the opening direction of the connectors 13 is parallel to the mounting surface of the electronic circuit board 3, can be easily manufactured.

Second Embodiment

Figure 8:
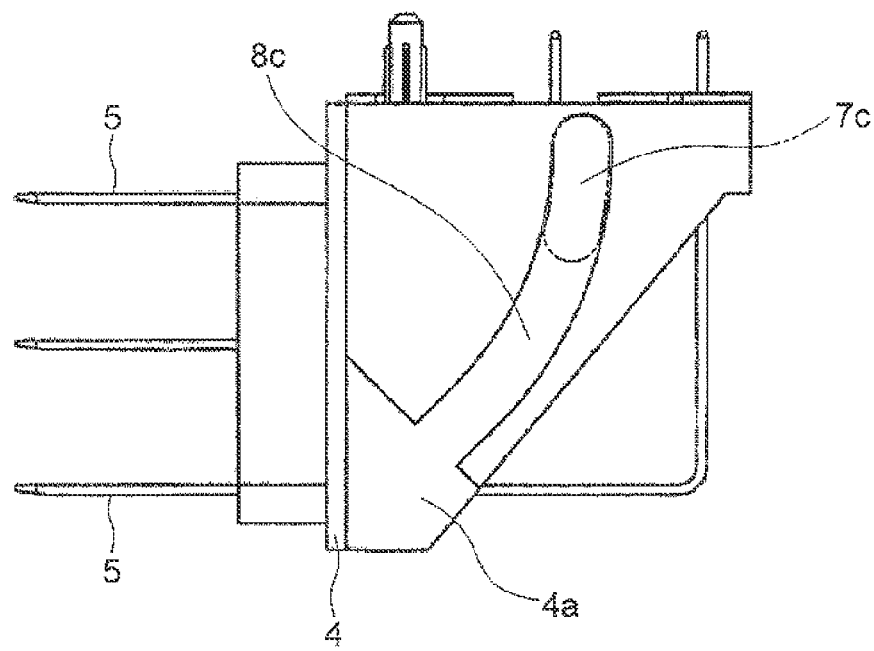
FIG. 8 is a side view illustrating a principal part of an electronic controller according to a second embodiment of the present invention.

FIG. 8 is a side view illustrating a principal part of an electronic controller 1 according to a second embodiment of the present invention.

In the second embodiment, a single guiding groove 8c is formed in a curved manner. A guiding projection 7c to be brought into engagement with the guiding groove 8c also has a curved shape.

The remaining configuration is the same as the electronic controller 1 of the first embodiment.

In the second embodiment, by turning the electronic circuit board 3, the guiding projection 7c slides along the guiding groove 8c relative thereto. As a result, the electronic circuit board 3 is assembled to the cover 2.

The guiding projection 7c has the curved shape. The guiding projection 7c is held in surface contact with the guiding groove 8c. Hence, the movement of the guiding projection 7c is restricted when the electronic circuit board 3 is turned. Therefore, the pin headers 4 turn along the fixed trajectories without deviating therefrom during the turning. As a result, the occurrence of a disadvantageous event, in which the distal ends of the terminals 5 come into contact with the wall surfaces of the cover 2 to damage the cover 2, can be prevented.

Even in the second embodiment, by forming the fixing projections 10 illustrated in FIG. 6 at the terminal end of the guiding groove 8c, the guiding projection 7c may be fixed by the fixing projections 10 over which the guiding projection 7c has passed. In this manner, the cover 2 and the pin headers 4 may be connected to each other.

Further, the cover 2 and the pin headers 4 may also be connected to each other in the following manner. The small-width portion 11 illustrated in FIG. 7 may be formed at the terminal end of the guiding groove 8c. By pressing the guiding projection 7c into the small-width portion 11, the cover 2 and the pin headers 4 are connected to each other.

Third Embodiment

Figure 9:
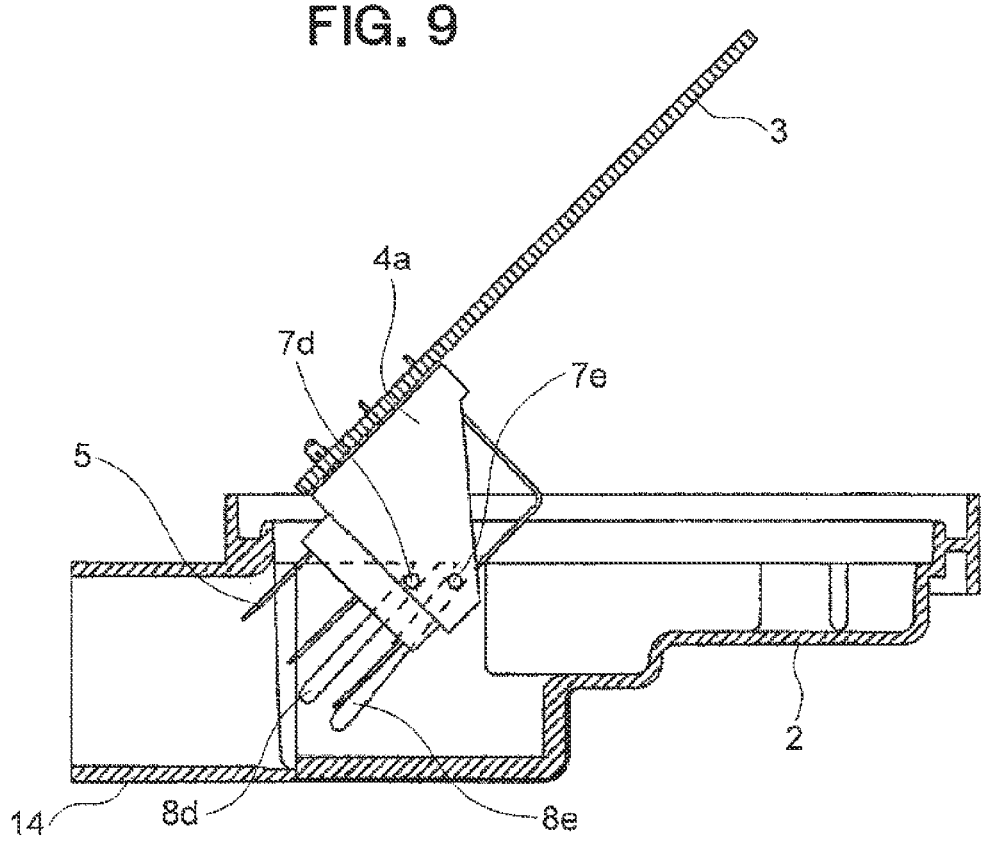
FIG. 9 is a side sectional view illustrating a principal part of an electronic controller according to a second embodiment of the present invention.

FIG. 9 is a side sectional view illustrating a principal part of an electronic controller 1 according to a third embodiment of the present invention.

In the third embodiment, a first guiding projection 7d and a second guiding projection 7e are provided on each of the side-surface portions 4a of the pin headers 4. A first guiding groove 8d to be brought into engagement with the first guiding projection 7d and a second guiding groove 8e to be brought into engagement with the second guiding projection 7e are provided to the cover 2.

The remaining configuration is the same as the electronic controller 1 according to the first embodiment.

In the third embodiment, the first guiding projections 7d and the second guiding projections 7e are provided to each of the pin headers 4, whereas the first guiding grooves 8d and the second guiding grooves 8e are provided to the cover 2. Therefore, the positions at which the first guiding projections 7d and the second guiding projections 7e are formed and the positions at which the first guiding grooves 8d and the second guiding grooves 8e are formed are changed as compared with those of the first embodiment. However, the same effects as those obtained by the first embodiment can be obtained with the electronic controller 1 of the third embodiment.

Although the guiding groove has been described as an example of the guiding portion in each of the embodiments described above, a guiding hole may be used in place of the guiding groove.

Moreover, the application of the present invention is not limited to the electronic controller 1 in which the openings 12 of the housings 14 of the connectors 13 are oriented in the horizontal direction with respect to the casing. The present invention is also applicable to the electronic controller 1 in which the openings 12 of the housings 14 are oriented at an angle of, for example, 45 degrees with respect to the electronic circuit board 3.

Moreover, the casing having the structure vertically divided into two parts, that is, the cover 2 and the base 6 is merely an example. The casing may also have a structure divided into three.

What is claimed is:

1. An electronic controller, comprising:
    an electronic circuit board having electronic components mounted thereon;
    a casing for receiving the electronic circuit board therein, comprising at least a first casing member and a second casing member; and
    a connector to be electrically connected to an external device, wherein:
    the connector comprises:
        a pin header pre-fixed onto the electronic circuit board and including a plurality of terminals whose base end portions are electrically connected to the electronic circuit board, the plurality of terminals being inserted into a pedestal; and
        a housing provided integrally with the first casing member, which surrounds distal end portions of the plurality of terminals extending in a direction along the electronic circuit board;
    one of the pin header and the first casing member comprises a guiding projection, whereas another of the pin header and the first casing member comprises a guiding portion to be brought into engagement with the guiding projection; and
    the guiding projection moves along the guiding portion relative thereto to turn the pin header pre-fixed onto the electronic circuit board to assemble the pin header to the housing.

2. An electronic controller according to claim 1, wherein:
    the guiding projection comprises a pair of guiding projections; and
    the pair of guiding projections respectively slide in a pair of the guiding portions formed in a linear fashion so as to be opposed to each other in nonparallel.

3. An electronic controller according to claim 1, wherein:
    the guiding projection comprises a pair of guiding projections; and
    the pair of guiding projections respectively slide in a pair of the guiding portions formed to extend in a curved manner so as to be opposed to each other at an equal distance.

4. An electronic controller according to claim 1, wherein:
    the guiding projection is formed in a curved shape; and
    the guiding projection slides in the single guiding portion formed continuously in a curved shape.

5. An electronic controller according to claim 1, wherein the guiding portion is formed on each of side-surface portions formed on both sides of the pin header along a direction in which the plurality of terminals extend.

6. An electronic controller according to claim 1, wherein the guiding projection is formed on each of side-surface portions formed on both sides of the pin header along a direction in which the plurality of terminals extend.

7. An electronic controller according to claim 1, wherein:
    fixing projections projecting inward are formed to a terminal end portion of the guiding portion, which is closed on a side opposite to an open start end portion; and
    the guiding projection is fixed by the fixing projections over which the guiding projection has passed.

8. An electronic controller according to claim 1, wherein:
    fixing projections projecting inward are formed to a terminal end portion of the guiding portion, which is closed on a side opposite to an open start end portion; and
    the guiding projection is fixed by the fixing projections over which the guiding projection has passed.

9. A method of manufacturing the electronic controller according to claim 1, the method comprising:
    mounting the pin header onto the electronic circuit board;
    bringing the guiding projection into engagement with the guiding portion in a state in which the electronic circuit board is inclined with respect to the first casing member; and
    assembling the electronic circuit board to the first casing member by turning the electronic circuit board in a state in which the guiding projection is held in engagement with the guiding portion to simultaneously turn the pin header so as to assemble the pin header to the housing.

* * * * *